(12) United States Patent
Papriwal et al.

(10) Patent No.: US 10,411,687 B2
(45) Date of Patent: Sep. 10, 2019

(54) NEAR ZERO QUIESCENT CURRENT CIRCUIT FOR SELECTING A MAXIMUM SUPPLY VOLTAGE

(71) Applicant: CIREL SYSTEMS PRIVATE LIMITED, Bangalore (IN)

(72) Inventors: Archit Papriwal, Bangalore (IN); Soham Bhattacharjee, West Bengal (IN); Leela Madhav Lakkimsetti, Bangalore (IN)

(73) Assignee: CIREL SYSTEMS PRIVATE LIMITED, Bangalore (IN)

( * ) Notice: Subject to any disclaimer, the term of this patent is extended or adjusted under 35 U.S.C. 154(b) by 0 days.

(21) Appl. No.: 15/946,546

(22) Filed: Apr. 5, 2018

(65) Prior Publication Data
US 2019/0207595 A1  Jul. 4, 2019

(30) Foreign Application Priority Data
Jan. 3, 2018  (IN) .............................. 201841000294

(51) Int. Cl.
*H03K 5/24* (2006.01)

(52) U.S. Cl.
CPC ................................ *H03K 5/2472* (2013.01)

(58) Field of Classification Search
CPC ...................................................... H03K 5/24
See application file for complete search history.

(56) References Cited

U.S. PATENT DOCUMENTS

| | | | |
|---|---|---|---|
| 9,130,553 B2 * | 9/2015 | Huisman | H03K 5/2472 |
| 10,243,554 B2 * | 3/2019 | Rachupalli | G05F 3/08 |

* cited by examiner

*Primary Examiner* — Hai L Nguyen
(74) *Attorney, Agent, or Firm* — Symbus Law Group, LLC; Clifford D. Hyra

(57) ABSTRACT

A circuit for selecting a maximum supply voltage from a first voltage source and a second voltage source is disclosed. The circuit comprises a comparator for comparing the first voltage and the second voltage. Based on the comparison, a first bias signal and a second bias signal are generated for biasing the gate terminals of a first power switch and a second power switch respectively. The first power switch and the second power switch are biased such that the maximum voltage among the first voltage and the second voltage appear at an output node.

13 Claims, 6 Drawing Sheets

US 10,411,687 B2

NEAR ZERO QUIESCENT CURRENT CIRCUIT FOR SELECTING A MAXIMUM SUPPLY VOLTAGE

This application claims priority from Indian patent application 201841000294, filed on Jan. 3, 2018, incorporated herein by reference.

TECHNICAL FIELD

The present disclosure relates to a voltage selector circuit. More specifically, the present disclosure relates to a maximum supply voltage selector with low voltage dropout and near zero quiescent current.

BACKGROUND OF THE INVENTION

Voltage selectors typically comprise two or more voltage supply points that may be selected using a selector switch. The selector switch may be implemented using diodes, MOSFETs or comparator circuits.

Referring to FIG. 1, a diode based voltage selector 100 is shown. The diode based voltage selector 100 comprises a first diode 105 and a second diode 110. The anode of the first diode 105 is connected to a first supply voltage V1 and the anode of the second diode 110 is connected to a second voltage supply V2. Further, output voltage Vmax (V1, V2) is taken from a common node connecting the cathodes of the first diode 105 and the second diode 110. More specifically, the output of the diode based voltage selector 100 is based on the maximum voltage between V1 and V2. However, the output voltage Vmax (V1, V2) is lower than the maximum input voltage by $V_d$, where $V_d$ is the forward drop voltage (approximately equal to 0.7V) of a diode. For example, if V1 is greater than V2, then Vmax (V1, V2)=V1-$V_d$. In another example, if V2 is greater than V1, then Vmax (V1, V2)=V2-$V_d$. The diode based voltage selector 100 has the advantage that only a small reverse leakage current is drawn from the maximum supply voltage.

Referring to FIG. 2, a back to back PMOS voltage selector 200 is shown. The PMOS voltage selector 200 comprises a first P-MOSFET 205 and a second P-MOSFET 210, where the first P-MOSFET 205 is connected to a first supply voltage V1 and the second P-MOSFET 210 is connected to a second supply voltage V2. More specifically, the first supply voltage V1 is provided at the drain terminal of the first P-MOSFET 205 and the second supply voltage V2 is provided at the drain terminal of the second P-MOSFET 210. Further, the bulk terminal and the source terminal of the first P-MOSFET 205 are shorted as shown. Similarly, the bulk terminal and source terminal of the second P-MOSFET 210 are also shorted. The drain terminal of the first P-MOSFET 205 is further connected to the gate terminal of the second P-MOSFET 210. Similarly, the drain terminal of the second P-MOSFET 210 is further connected to the gate terminal of the first P-MOSFET 205. Furthermore, the source terminals of the first P-MOSFET 205 and the second P-MOSFET 210 are connected together to form an output node.

If the first supply voltage V1 is greater than the second supply voltage V2 by a threshold voltage $V_{TH}$, then the first P-MOSFET 205 is switched ON and the second P-MOSFET 210 is switched OFF, thereby providing V1 at the output node. Otherwise, if the second supply voltage V2 is greater than the first supply voltage V1, then the second P-MOSFET 210 is switched ON and the first P-MOSFET 205 is switched OFF, thereby providing V2 at the output node. However, if the input voltages, the first supply voltage V1 and the second supply voltage V2 are very close to each other, then both the first P-MOSFET 205 and the second P-MOSFET 210 have very small gate-source voltage. As a result, both the first P-MOSFET 205 and the second P-MOSFET 210 fail to provide high load currents when required. Further, if a high load current is drawn from the voltage selector, then the bulk diodes of the first P-MOSFET 205 and/or the second P-MOSFET 210 conduct giving V1-$V_{TH}$ or V2-$V_{TH}$ at the output node.

Referring to FIG. 3, a comparator-based voltage selector 300 is shown. In the comparator-based voltage selector 300, a comparator 305 compares the first voltage V1 and the second voltage V2. Further, based on the output of the comparator, a first P-MOSFET 310 or a second P-MOSFET 315 is switched ON. Subsequently, the higher voltage between V1 and V2 appears at an output node. It should be understood that the voltage dropout between the input and the output is equal to the drain-source voltage $V_{DS}$ of the P-MOSFET in ON state. Further, the comparator 305 constantly draws a quiescent current from one of the first voltage V1 and the second voltage V2. For example, if the first voltage V1 is supplied by a battery (not shown) and the second voltage V2 is supplied by a wall voltage adaptor working of the mains supply (not shown, from here on referred to as adaptor), then drawing of quiescent current from the battery would results in faster draining of the battery. In order to overcome this shortcoming, the quiescent current of the comparator 305 has to be reduced.

SUMMARY OF THE INVENTION

This summary is provided to introduce a selection of concepts in a simple manner that is further described in the detailed description of the disclosure. This summary is not intended to identify key or essential inventive concepts of the subject matter nor is it intended for determining the scope of the disclosure.

In order to overcome the problems discussed in above circuits, a circuit for selecting a maximum supply voltage between a first voltage and a second voltage is disclosed.

It is one object of the present disclosure is to provide a circuit for selecting a maximum supply voltage between a first voltage and a second voltage. The circuit comprises a comparator for receiving a first voltage and a second voltage, from a first voltage source and a second voltage source, respectively. The comparator further generates a difference signal by comparing the first voltage and the second voltage, wherein the difference signal at the output of the comparator is 0V when the first voltage is greater than the second voltage, and when the second voltage is greater than the first voltage, the difference signal at the output of the comparator is pulled up to the first voltage. The circuit further comprises a first biasing circuit for generating a first bias signal based on the difference signal, and a second biasing circuit for generating a second bias signal based on the difference signal. The circuit further comprises a first power switch and a second power switch. The first power switch supplies the first voltage at an output node and the second power switch supplies the second voltage at the output node. Further, the first power switch and the second power switch are selectively configured using the first bias signal and the second bias signal respectively, for providing maximum supply voltage as an output voltage at an output node.

An example of a method for selecting a maximum supply voltage between a first voltage and a second voltage is disclosed. The method comprises receiving a first voltage and a second voltage, from a first voltage source and a second voltage source, respectively. The method further comprises generating a difference signal from by comparing the first voltage and the second voltage. The difference signal at the output of the comparator is 0V when the first voltage is greater than the second voltage and the difference signal at the output of the comparator is pulled up to the first voltage when the second voltage is greater than the first voltage. The method further comprises generating a first bias signal and a second bias signal based on the difference signal. The first bias signal and the second bias signal generated are used to selectively configure one of a first power switch and a second power switch for providing maximum supply voltage as an output voltage at an output node. More specifically, the first power switch supplies the first voltage at the output node and the second power switch supplies the second voltage at the output node.

To further clarify advantages and features of the present disclosure, a more particular description of the disclosure will be rendered by reference to specific embodiments thereof, which is illustrated in the appended figures. It is to be appreciated that these figures depict only typical embodiments of the disclosure and are therefore not to be considered limiting of its scope. The disclosure will be described and explained with additional specificity and detail with the accompanying figures.

BRIEF DESCRIPTION OF THE FIGURES

The disclosure will be described and explained with additional specificity and detail with the accompanying figures in which.

Figure 1:
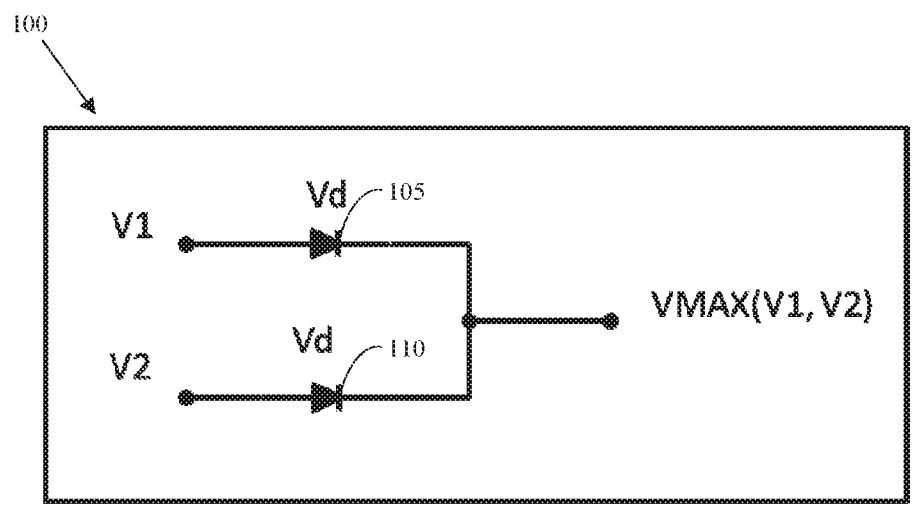
FIG. 1 illustrates a diode based voltage selector, in accordance with prior art.

Further, persons skilled in the art to which this disclosure belongs will appreciate that elements in the figures are illustrated for simplicity and may not have been necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those of ordinary skill in the art having benefit of the description herein.

DETAILED DESCRIPTION OF THE INVENTION

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications to the disclosure, and such further applications of the principles of the disclosure as described herein being contemplated as would normally occur to one skilled in the art to which the disclosure relates are deemed to be a part of this disclosure.

It will be understood by those skilled in the art that the foregoing general description and the following detailed description are exemplary and explanatory of the disclosure and are not intended to be restrictive thereof.

The terms "comprises", "comprising", or any other variations thereof, are intended to cover a non-exclusive inclusion, such that a process or method that comprises a list of steps does not include only those steps but may include other steps not expressly listed or inherent to such a process or a method. Similarly, one or more devices or sub-systems or elements or structures or components preceded by "comprises . . . a" does not, without more constraints, preclude the existence of other devices, other sub-systems, other elements, other structures, other components, additional devices, additional sub-systems, additional elements, additional structures, or additional components. Appearances of the phrase "in an embodiment", "in another embodiment" and similar language throughout this specification may, but do not necessarily, all refer to the same embodiment.

Unless otherwise defined, all technical and scientific terms used herein have the same meaning as commonly understood by one of ordinary skill in the art to which this disclosure belongs.

The present disclosure relates to a circuit for selecting a maximum supply voltage from a first voltage and a second voltage. The circuit helps in addressing the problem of high steady state quiescent currents associated with existing voltage selector circuits. More specifically, the circuit disclosed herein, draws quiescent current only from a chosen supply (one of the first voltage and the second voltage). In other words, the circuit avoids drawing of quiescent current from both the voltage supplies, thereby reducing the quiescent current drawn from one of the critical power supplies. Further, the chosen supply may not be necessarily available at all times. One such scenario is when the first voltage supply is from an adaptor and the second supply voltage is a battery. If the adaptor is not available at all times as in case of portable electronic devices, the quiescent current drawn from the battery supply is reduced. Furthermore, the circuit also has a low dropout voltage between the input supply and the output.

Embodiments of the present disclosure will be described below in detail with reference to the accompanying FIGS. 4A-4C.

Figure 4A:
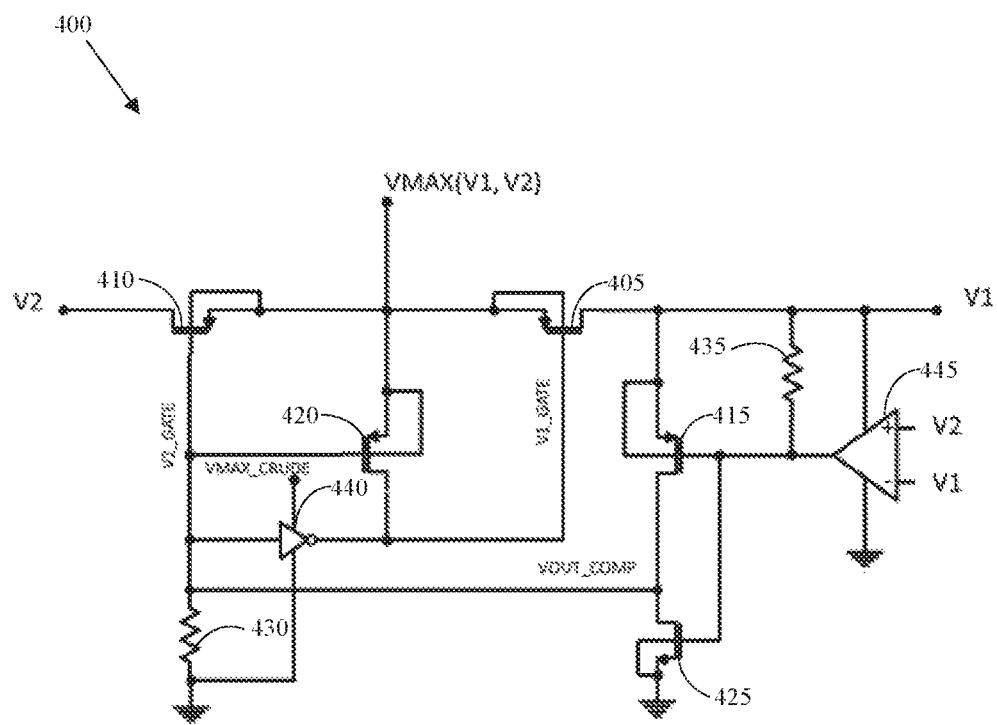
FIGS. 4A, 4B and 4C illustrate a maximum voltage selector, in accordance with one embodiment of the present disclosure.
Figure 4B:
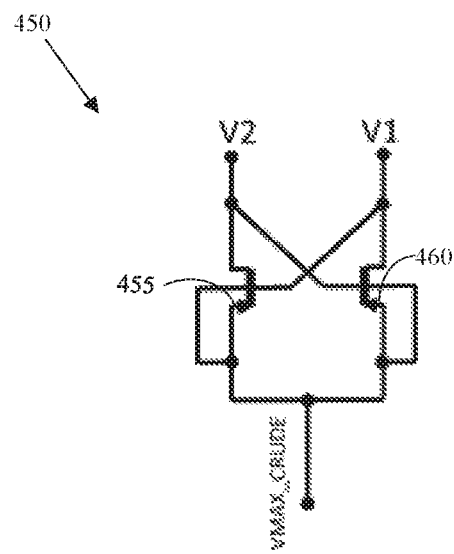
Figure 4C:
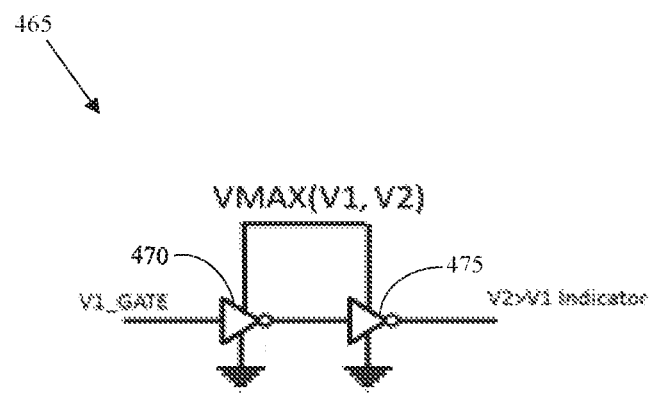

Referring to FIGS. 4A, 4B and 4C, a maximum voltage selector 400 is shown, in accordance with one embodiment of the present disclosure. The maximum voltage selector 400 is used to select a maximum voltage between a first voltage V1 and a second voltage V2. In one example, the first voltage V1 may be supplied by an adaptor and the second voltage V2 may be supplied by a battery.

The maximum voltage selector 400 comprises a first power switch 405 and a second power switch 410. In one embodiment, the first power switch 405 and the second power switch 405 are P-MOSFETs. The maximum voltage selector 400 further comprises a third P-MOSFET 415, a fourth P-MOSFET 420 and an N-MOSFET 425. The source and bulk terminals of each of the third P-MOSFET 415, the fourth P-MOSFET 420 and the N-MOSFET 425 are shorted as shown. The maximum voltage selector 400 further comprises a pull-down resistor 430, a pull-up resistor 435 and an inverter 440. The drains of the first power switch 405 and the second power switch 410 are connected to a first node and a second node respectively. The first node is at the first voltage V1 and the second node is at the second voltage V2. Further, the source terminals of the first power switch 405 and the second power switch 410 are connected to an output node. The output node delivers an output voltage VMAX (V1, V2) to a load. VMAX(V1, V2) is the maximum voltage between the first voltage V1 and the second voltage V2.

The maximum voltage selector 400 further comprises a comparator 445 powered by the first voltage V1. The comparator 445 compares the first voltage V1 and the second voltage V2. More specifically, the first voltage V1 is provided at the inverting terminal and the second voltage V2 is provided at the non-inverting terminal of the comparator 445. Based on the comparison of the first voltage V1 and the second voltage V2, the comparator 445 produces a difference signal. The difference signal may have two values such as high (V1) and low (0V). For example, if the first voltage V1 is greater than the second voltage V2, then the difference signal is low. Similarly, if the first voltage V1 is lesser than the second voltage V2, then the difference signal is high. Further, when the adaptor is plugged out, i.e., when the first voltage source is removed, the first voltage V1 may transition and discharge towards 0V. During the transition, the first voltage V1 may reach a voltage value such that the difference signal is undefined. In order to avoid the occurrence of the undefined state, the pull-up resistor 435 is connected between the output of the comparator 445 and the first node. Consequently, when the difference signal is undefined, the pull-up resistor 435 weakly pulls up the output of the comparator 445 to the first voltage V1 (high).

The output of the comparator 445 i.e., the difference signal is further provided as an input to a first inverter. In the present embodiment, the first inverter is a CMOS-based inverter comprising the N-MOSFET 425 and the third P-MOSFET 415 and is powered by the first voltage V1. More specifically, the output of the comparator 445 is fed to the gate terminals of the N-MOSFET 425 and the third P-MOSFET 415. Further, the output of the first inverter (henceforth called VOUT_COMP) is taken from a common node connecting the drain terminals of the N-MOSFET 425 and the third P-MOSFET 415.

VOUT_COMP is further used to generate a first bias signal V1_GATE and a second bias signal V2_GATE. More specifically, the second bias signal V2_GATE is equal to VOUT_COMP. The pull-down resistor 430 ensures that the output of the second inverter 440 is defined when the first voltage V1 is transitioning and discharging towards 0V (i.e., on removing the adaptor). In this situation, the pull-down resistor 430 ensures that VOUT_COMP is defined and does not oscillate. Further, the first bias signal V1_GATE is generated by inversion of the second bias signal V2_GATE using the second inverter 440. The second inverter 440 is powered by a voltage VMAX-CRUDE. Consequently, the output of the second inverter 440 may take two values such as high (VMAX-CRUDE) and low (0V).

Figure 2:
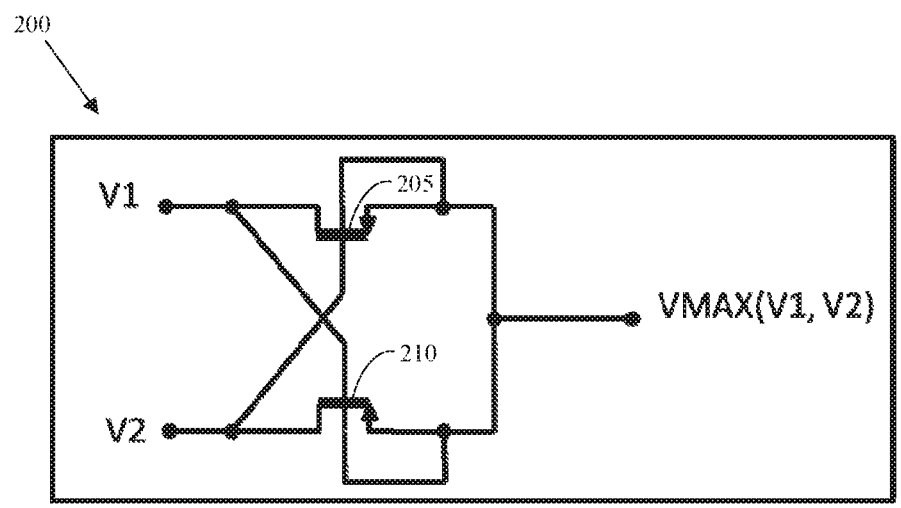
FIG. 2 illustrates a back to back PMOS voltage selector configuration, in accordance with prior art.
Figure 3:
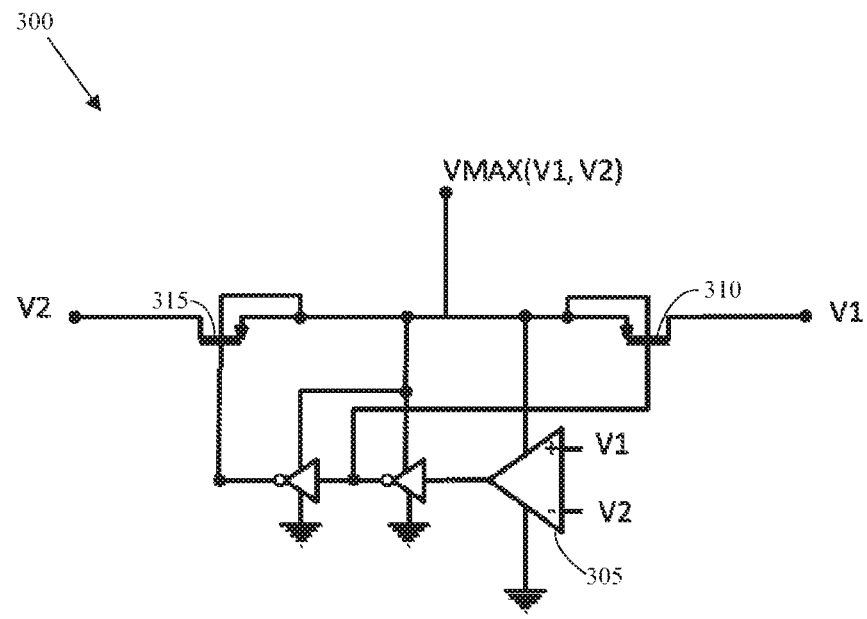
FIG. 3 illustrates a comparator based voltage selector, in accordance with prior art.

In one embodiment, VMAX-CRUDE is generated by a back-to-back PMOS voltage selector 450 formed using a fifth P-MOSFET 455 and a sixth P-MOSFET 460 as shown in FIG. 4B. The back-to-back PMOS voltage selector 450 is formed by cross-coupling the gate terminal of the fifth P-MOSFET 455 with the drain terminal of the sixth P-MOSFET 460 and by cross-coupling the gate terminal of the sixth P-MOSFET 460 with the drain terminal of the fifth P-MOSFET 455. Further, the output VMAX-CRUDE of the back-to-back PMOS voltage selector 450 is taken from a common node connecting the source terminals of the fifth P-MOSFET 455 and the sixth P-MOSFET 460. The operation of the back-to-back PMOS voltage selector 450 is same as described using FIG. 2. The back-to-back PMOS voltage selector 450 ensures that VMAX-CRUDE is equal to the maximum supply voltage among the first voltage V1 and the second voltage V2. Further, the back-to-back PMOS voltage selector 450 also ensures that there is no current flow between the first voltage V1 and the second voltage V2. Further, the fourth P-MOSFET 420 is connected such that the drain terminal is connected to the output of the second inverter 440, the source terminal is connected to the output node (i.e., the signal VMAX (V1, V2)) and the gate terminal connected to the output of the first inverter (i.e., the signal VOUT_COMP).

The first bias signal V1_GATE from the output of the second inverter 440 is further provided to the gate of the first power switch 405 and the second bias signal V2_GATE is provided to the gate terminal of the second power switch 410. Now, consider that the second voltage V2 is greater than a threshold voltage $V_{TH}$, while the first voltage V1 is less than a minimum voltage V_MIN_COMP. The minimum voltage V_MIN_COMP may be defined as the supply voltage at which the comparator 445 is unable to drive its output to the first voltage V1 or zero with adequate strength so as to overcome the impedance of the pull-up resistor 435. When the first voltage V1 is less than V_MIN_COMP, VMAX_CRUDE becomes equal to the second voltage V2 and the pull-up resistor 435 pulls the output of the comparator 445 to the first voltage V1. In other words, VOUT_COMP is pulled down to 0V. As a result, V2_GATE is pulled low (towards 0V) and V1_GATE is pulled high (towards the second voltage VMAX_CRUDE=V2). More specifically, the gate-source voltage of the second power switch 410 is V2_GATE-VMAX (V1,V2). In one example, if the first voltage V1 is 0V, then the gate-source voltage of the second power switch 410 is −VMAX(V1,V2)=−V2. Similarly, the gate-source voltage of the first power switch 405 is V1_GATE-VMAX (V1,V2). When the first voltage V1 is 0V, V1_GATE becomes equal to the second voltage V2. Further, VMAX(V1,V2) also becomes equal to the second voltage V2 as determined by the VMAX_CRUDE supply to the second inverter 440. Consequently, the gate-source voltage of the first power switch 405 becomes equal to 0V. In other words, the second power switch 410 is switched ON and the first power switch 405 is switched OFF, causing the output voltage VMAX (V1, V2) to be pulled up to the second voltage V2. Further, as the first power switch 405 is open, leakage currents from the output node to the first voltage source are prevented.

Consider another example where the second voltage V2 is zero and the first voltage V1 is greater than V_MIN_COMP. As the first voltage V1 is greater than V_MIN_COMP, the comparator 445 is capable of driving its output to high or low with good drive strength. In this case, VMAX_CRUDE is equal to the first voltage V1. As the first voltage V1 is greater than the second voltage V2, the output of the comparator 445 is pulled low, thereby causing VOUT_COMP to become equal to the first voltage V1. Now, the second inverter 440 is powered by VMAX_CRUDE which is equal to the first voltage V1. Further, the input to the second inverter 440 is also equal to the first voltage V1. Consequently, the output of the second inverter 440 i.e., V1_GATE is pulled low. Simultaneously, V2_GATE is pulled high. Therefore, the second power switch 410 is turned OFF and the first power switch 405 is turned ON. Hence, the first voltage V1 appears at the output node as VMAX (V1, V2) with no additional leakage from the output node to the second voltage source.

Consider yet another example where the first voltage V1 is greater than the second voltage by threshold voltage $V_{TH}$ and also the first voltage V1 is greater than V_MIN_COMP. Now, VMAX_CRUDE is pulled towards the first voltage V1. Further, the output of the comparator 445 becomes 0V and VOUT_COMP is set to the first voltage V1. Consequently, V1_GATE is pulled low while V2_GATE is pulled towards the first voltage V1 causing the first power switch 405 to be switched on and the second power switch 410 to be switched OFF. Hence, VMAX (V1, V2) becomes equal to the first voltage V1 with no additional leakage current pushed into or drawn from the second voltage source.

Consider yet another example where the first voltage V1 may be less than the second voltage V2, while the second voltage V2 is greater than V1 by threshold voltage $V_{TH}$ and the first voltage V1 is greater than V_MIN_COMP. In this case, VMAX_CRUDE becomes equal to the second voltage V2. Further, the output of the comparator 445 is pulled towards the first voltage V1 causing VOUT_COMP to be pulled low. As a result, V1_GATE is pulled towards the second voltage V2 while V2_GATE is pulled low. Hence, the second power switch 410 is switched ON and the first power switch 405 is switched OFF, thereby causing VMAX (V1, V2) to be equal to the second voltage V2 with no additional leakage current pushed into or drawn from the first voltage source.

In yet another example, the first voltage V1 may be approximately equal to the second voltage V2 and the first voltage V1 is greater than V_MIN_COMP. In this case, if the current drawn by the second inverter 440 is sufficiently high, then VMAX_CRUDE falls to V1-VD. The output of the comparator 445 would be high (V1) or low (0V) depending on the previous state of the first voltage V1 and the second voltage V2, and the hysteresis of the comparator 445. Consequently, VOUT_COMP may be one of the first voltage V1 or 0V. If VOUT_COMP is equal to the first voltage V1, then the second inverter 440 pulls V1_GATE to 0V, thereby causing the output voltage VMAX (V1, V2) to be equal to the first voltage V1. On the other hand, if VOUT_COMP is 0V, then V1_GATE is pulled by the second inverter 440 towards VMAX_CRUDE and also by the fourth P-MOSFET 420 towards VMAX (V1, V2). The fourth P-MOSFET 420 has higher drive strength to the pull up a P-MOSFET (not shown) inside the second inverter 440 when compared to the third P-MOSFET 415. Therefore, V1_GATE is more strongly pulled towards VMAX (V1, V2). Subsequently, current drawn from VMAX_CRUDE also reduces. As a result, VMAX_CRUDE is pulled closer to VMAX (V1, V2). Further, the leakage current from VMAX (V1, V2) to the first voltage V1 is also avoided.

In one embodiment, resistor based skewing may be added to the comparator 445 to implement a voltage hysteresis on the input of the comparator 445, in order to avoid chattering of the output of the comparator 445 when the first voltage V1 and the second voltage V2 are very close to each other.

In another example, VMAX (V1, V2) may be initially undefined during start-up phase. As a result, the fourth P-MOSFET 420 is initially unable to define V1_GATE. However, as the values of VMAX_CRUDE, VOUT_COMP and V2_GATE are defined independently, VMAX (V1,V2) is loosely defined. Consequently, the fourth P-MOSFET 420 is brought into operation and latch up condition is avoided during the start-up phase.

In another embodiment, V1_GATE may be buffered on VMAX (V1, V2) supply using a buffer circuit 465. The buffer circuit comprises third inverter 470 and a fourth inverter 475 as shown in FIG. 4C, and is used as a flag to indicate the higher voltage between the first voltage V1 and the second voltage V2.

In the present embodiment, the quiescent current appearing at the output node VMAX(V1, V2) is solely due to gate leakage currents drawn from a single source (the second voltage source V2 in the present case). The method disclosed also provides a predictable behaviour in voltage selection when the two supplies voltages are close to each other. If the first voltage V1 is very low (below the threshold voltage $V_{TH}$ of a MOS transistor), the output of the comparator 445 is defined by the pull up resistor 435. That is, the voltage selector circuit disclosed herein may be used even when the first voltage V1 is a very low voltage. Further, the voltage selector circuit also helps in avoiding body diode conduction in the first power switch 405 and the second power switch 410 when the first voltage V1 and the second voltage V2 are very close to each other.

Figure 5:
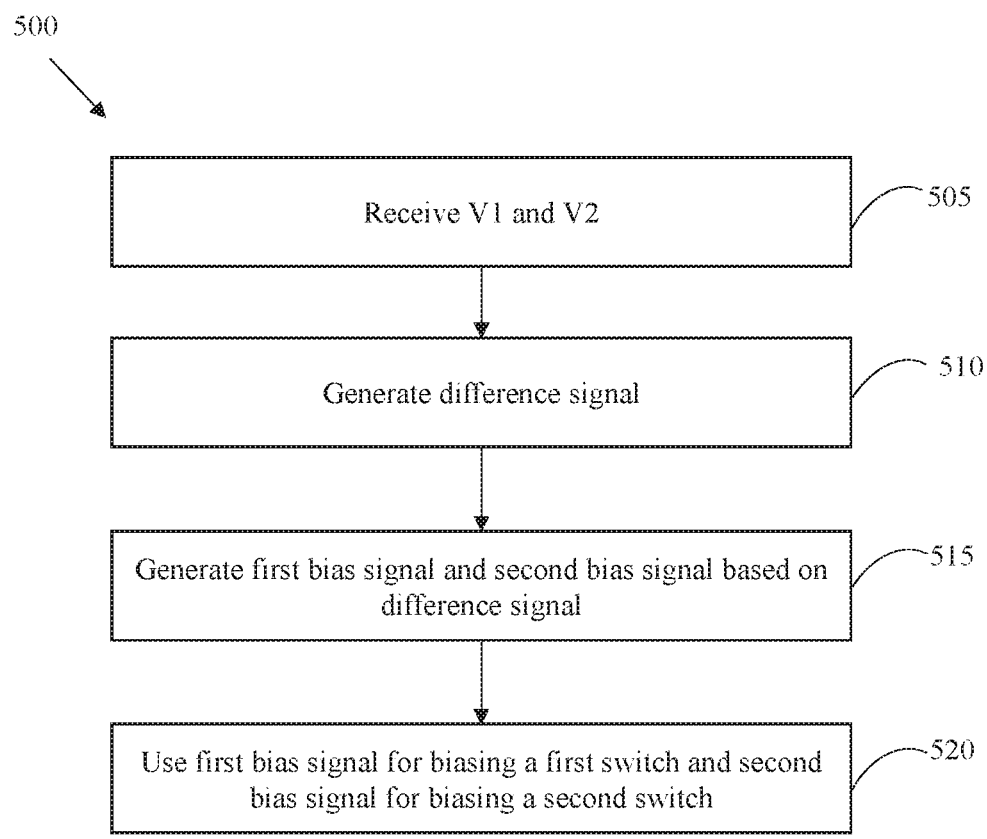
FIG. 5 shows a method of selecting a maximum voltage, in accordance with one embodiment of the present disclosure.

Referring to FIG. 5, a method 500 of selecting a maximum supply voltage between a first voltage and a second voltage is shown, in accordance with one embodiment of the present disclosure.

At step 505, a first voltage and a second voltage are received from a first voltage source and a second voltage source, respectively.

At step 510, a difference signal is generated from the first voltage and the second voltage. The difference signal is set to the first voltage when the first voltage is greater than the second voltage by a threshold voltage. Similarly, the difference signal is set to the second voltage when the second voltage is greater than the first voltage by the threshold voltage.

At step 515, a first bias signal and a second bias signal are generated based on the difference signal.

At step 520, the first bias signal and the second bias signal are used to selectively configure one of a first power switch and a second power switch for providing maximum supply voltage as an output voltage at an output node. More specifically, the first power switch supplies the first voltage at the output node and the second power switch supplies the second voltage at the output node.

While specific language has been used to describe the disclosure, any limitations arising on account of the same are not intended. As would be apparent to a person skilled in the art, various working modifications may be made to the method in order to implement the inventive concept as taught herein.

The figures and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. A circuit, comprising:
a comparator powered by a first voltage, wherein the comparator compares the first voltage and a second voltage, wherein the first voltage is presented on an inverting terminal and the second voltage on a non-inverting terminal of the comparator;
a pull-up resistor having a first terminal and a second terminal configured to receive the first voltage across the first terminal and the second terminal, the second terminal being the output of the comparator;
a first inverter powered by the first voltage, wherein the first inverter inverts the output of the comparator;
a pull-down resistor having first terminal connected to the output of the first inverter and second terminal connected to ground;
a first P-MOSFET having gate terminal connected to the first terminal of the pull-down resistor, source terminal connected to the second voltage and drain and bulk terminals connected to an output node;
a second inverter having an input terminal connected to the gate of the first P-MOSFET and an output terminal, wherein the second inverter is powered by maximum of one of the first voltage and the second voltage;
a second P-MOSFET having gate terminal connected to the output terminal of the second inverter, source terminal connected to the first voltage and drain and bulk terminals connected to the output node; and
a third P-MOSFET having gate terminal connected to the gate terminal of the first P-MOSFET, source terminal connected to the gate terminal of the second P-MOSFET and drain and bulk terminals connected to the output node.

2. The circuit as claimed in claim 1, wherein the maximum of one of the first voltage and the second voltage is selected by a back-to-back PMOS voltage selector.

3. The circuit as claimed in claim 1, wherein the first inverter is a CMOS-based inverter.

4. A circuit for selecting a maximum supply voltage between a first voltage and a second voltage, the circuit comprising:
a comparator for
receiving a first voltage and a second voltage, from a first voltage source and a second voltage source, respectively; and
generating a difference signal by comparing the first voltage and the second voltage, wherein the difference signal at the output of the comparator is 0V when the first voltage is greater than the second voltage, and wherein the difference signal at the output of the comparator is pulled up to the first voltage when the second voltage is greater than the first voltage;
a first biasing circuit for generating a first bias signal based on the difference signal;
a second biasing circuit for generating a second bias signal based on the difference signal; and
a first power switch and a second power switch, wherein the first power switch supplies the first voltage at an output node and the second power switch supplies the second voltage at the output node, wherein the first power switch and the second power switch are selectively configured using the first bias signal and the second bias signal respectively, for providing maximum supply voltage as an output voltage at an output node.

5. The circuit as claimed in claim 4, wherein the first power switch is a P-MOSFET.

6. The circuit as claimed in claim 4, wherein the second power switch is a P-MOSFET.

7. The circuit as claimed in claim 4, wherein the first bias signal switches ON the first power switch and the second bias signal switches OFF the second power switch when the first voltage is greater than the second voltage.

8. The circuit as claimed in claim 4, wherein the first bias signal switches OFF the first switch and the second bias signal switches ON the second power switch when the second voltage is greater than the first voltage.

9. The circuit as claimed in claim 4, wherein the first bias signal switches OFF the first switch and the second bias signal switches ON the second power switch when difference between the first voltage and the second voltage is less than the threshold voltage of a MOSFET.

10. A method for selecting a maximum supply voltage between a first voltage and a second voltage, the method comprising:
receiving a first voltage and a second voltage, from a first voltage source and a second voltage source, respectively;
generating a difference signal by comparing the first voltage and the second voltage, wherein the difference signal at the output of the comparator is 0V when the first voltage is greater than the second voltage, and wherein the difference signal at the output of the comparator is pulled up to the first voltage when the second voltage is greater than the first voltage; and
generating a first bias signal and a second bias signal based on the difference signal, wherein the first bias signal and the second bias signal are used to selectively configure one of a first power switch and a second power switch for providing maximum supply voltage as an output voltage at an output node, wherein the first power switch supplies the first voltage at the output node and the second power switch supplies the second voltage at the output node.

11. The method as claimed in claim 10, wherein the first bias signal switches ON the first power switch and the second bias signal switches OFF the second power switch when the first voltage is greater than the second voltage.

12. The method as claimed in claim 10, wherein the first bias signal switches OFF the first switch and the second bias signal switches ON the second power switch when the second voltage is greater than the first voltage.

13. The method as claimed in claim 10, wherein the first bias signal switches OFF the first switch and the second bias signal switches ON the second power switch when difference between the first voltage and the second voltage is less than the threshold voltage.

* * * * *